(12) United States Patent
Kumar

(10) Patent No.: US 7,346,100 B2
(45) Date of Patent: Mar. 18, 2008

(54) ESTIMATING GAIN AND PHASE IMBALANCE IN UPCONVERTING TRANSMITTERS

(75) Inventor: Anil Kv Kumar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 653 days.

(21) Appl. No.: 10/409,058

(22) Filed: Apr. 9, 2003

(65) Prior Publication Data

US 2004/0202236 A1 Oct. 14, 2004

(51) Int. Cl.
*H04B 1/38* (2006.01)
(52) U.S. Cl. ........................ 375/219; 375/140; 375/261; 375/298; 375/316; 330/2; 330/107
(58) Field of Classification Search ................ 375/219, 375/259, 298, 261, 316, 140, 2, 107
See application file for complete search history.

(56) References Cited

U.S. PATENT DOCUMENTS

| 5,381,108 | A | * | 1/1995 | Whitmarsh et al. | ............ 330/2 |
| 2003/0035470 | A1 | * | 2/2003 | Gu | .............................. 375/219 |
| 2003/0223480 | A1 | * | 12/2003 | Cafarella | ..................... 375/219 |
| 2004/0013204 | A1 | * | 1/2004 | Dinur | ......................... 375/261 |

\* cited by examiner

*Primary Examiner*—Chieh M. Fan
*Assistant Examiner*—Eva Zheng
(74) *Attorney, Agent, or Firm*—J. Dennis Moore; W. James Brady, III; Frederick J. Telecky, Jr.

(57) ABSTRACT

Estimation of gain and phase imbalance of an upconverting transmitter. A transmitter transmits symbols containing vector components of pre-specific relationship in an analog signal. A receiver (also contained in a transceiver along with the transmitter) examines the symbols to determine the phase and gain imbalances in the transmitter based on the analog signal. An aspect of the present invention enables the balance estimation circuit to be integrated along with the transmitter and the receiver into a single monolithic integrated circuit.

18 Claims, 3 Drawing Sheets

ESTIMATING GAIN AND PHASE IMBALANCE IN UPCONVERTING TRANSMITTERS

BACKGROUND OF THE INVENTION

1. Field of the Invention

The present invention relates to communication systems, and more specifically to a method and apparatus for estimating gain and phase imbalance in upconverting transmitters which transmit each symbol as multiple vector components.

2Related Art

Upconverting transmitters (hereafter generally referred to as "transmitters") are often used to transmit a sequence of symbols, with each symbol containing one or more bits. Each symbol may be represented by a vector containing multiple components ("vector components"). Each of multiple carrier signals may be used to carry a corresponding component of the sequence of symbols. In general, the sequence of vector components are used to modulate the corresponding carrier signal. For example assuming a sequence of symbols are represented by vectors {a1, b1}, {a2, b2}, ..., {az, bz}, the sequence of vector components a1, a2, ..., az may be encoded in a first carrier signal, and the vector components b1, b2, ..., bz may be encoded in a second carrier signal.

A receiver receives the modulated carrier signals, recovers the vector components, and generates the symbols based on the recovered vector components. A technique commonly referred to as Quadrature-Amplitude Modulation, in which two carrier signals differing in phase by 90 degrees are used, is an example of an approach which transmits symbols in the form of symbols represented by two vector components. Quadrature-Amplitude modulation is described in further detail in a book entitled, "Digital Communications", By: Simon Haykin, Publishers: John Wiley & sons, ISBN Number: 0471629472.

In general, it is desirable that both quadrature carrier signals (encoding different respective components) have same amplitudes and have exact 90 degree phase relationship to enable a receiver to accurately recover all the vector components. However the gain and phase relationship of these carrier signals may be different in practice, for example, due to deviation of various components from ideal characteristics. In addition, amplitude imbalances in the modulating signals can also result in a similar effect as amplitude imbalance in the carrier signals themselves. In general, appropriate corrections can be applied if the imbalances in modulation are accurately estimated. At least for such a reason, it may be desirable to estimate the phase and gain imbalances in a transmitter.

SUMMARY OF THE INVENTION

An aspect of the present invention provides a monolithic integrated circuit containing an on-chip correction circuit which estimates the phase and gain imbalances of a transmitter. Due to the integration of the correction circuit with the transmitter, the number of components in a device may be reduced.

In an embodiment, a transmitter sends a first symbol and then a second symbol in the form an analog signal, wherein said first symbol and said second symbol are encoded in the analog signal at different time points. A receiver receives the analog signal and recovers the first symbol and said second symbol. A correction circuit measures a first power corresponding to the first symbol and a second power corresponding to the second symbol, and estimates an imbalance in said transmitter based on said first power and said second power. The symbols may be designed with a specific relationship to enable the phase and gain imbalances to be estimated as described below with examples.

With reference to phase imbalance, the vectors forming the symbols are designed such that each of a pair of vectors forming one of the two symbols comprises a same modulating signal (or value in the described embodiments) of same sign for vector components, and a pair of vectors forming another one of said first symbol and said second symbol comprises the same modulating signal but with opposite sign. The first power is measured in response to sending said same modulating signal of same sign, and the second power is measured in response to sending said same modulating signal with opposite sign. The phase imbalance is computed according to an equation (r1−1)/(r1+1), wherein r1 equals (first power/said second power).

With reference to gain imbalance, the vectors forming the symbols are designed such that one of said first symbol and said second symbol containing a first vector of a known modulating signal and a second vector of zero value, and another one of said first symbol and said second symbol containing said first vector of zero value and said second vector of the known modulating signal. The gain imbalance is then computed according to an equation (square root of (said second power/said first power)).

According to another aspect of the present invention, the correction circuit may contain a multiplexor to select the analog signal or an external signal, wherein said external signal is generated by an external device. The analog signal is selected when the imbalances are being estimated.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the following accompanying drawings.

DETAILED DESCRIPTION OF THE PREFERRED EMBODIMENTS

1. Overview

An aspect of the present invention provides an estimator circuit ("on-chip estimator") and a transmitter implemented on the same die, with the estimator circuit being designed to estimate the phase and gain imbalance in the analog signals generated by the transmitter. The overall cost of implementation of implementation due to such an approach may be reduced as the total number of components may be minimized, and also as estimation can be potentially performed without use of external equipment. In addition, the estimation may be performed while the transmitter is deployed for use also, and thus the estimates may accurately reflect the present imbalances introduced by the transmitter any time during operation.

Another aspect of the present invention enables phase and gain imbalances to be estimated based on data recovered in a receiver by having a transmitter transmit digital data elements having a specific relationship. As the estimation may not depend on the phase or frequency relationship of carrier signals used, the transceiver and receiver may potentially be implemented using oscillators having independent phase or frequency. In an embodiment, the receiver and the transmitter form part of a single transceiver.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Device

Figure 1:
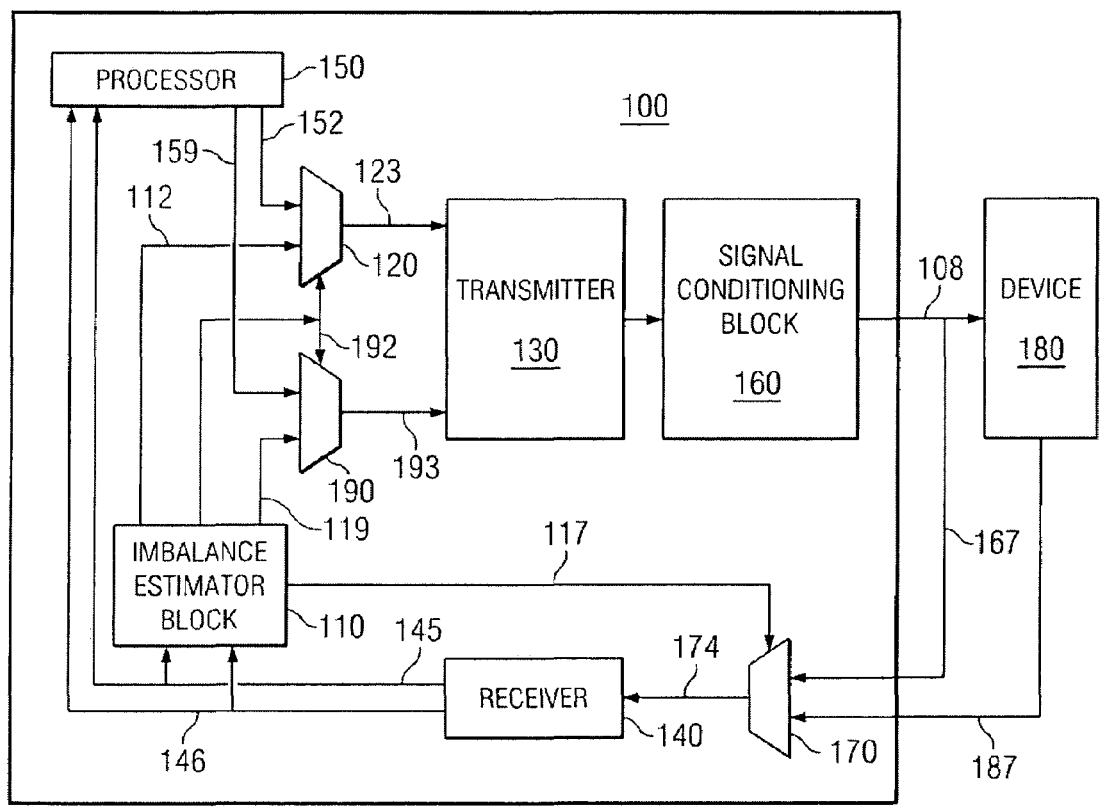
FIG. 1 is a block diagram illustrating an example environment in which the present invention can be implemented.

FIG. 1 is a block diagram illustrating an example device in which the present invention can be implemented. Device 100 is shown sending analog signals to device 180 on path 108, and receiving analog signals from device 180 on path 187. Only the details of device 100 are shown and described for conciseness. However, device 180 may also be implemented similarly. In addition, device 100 is shown containing only a few components for conciseness. However, many more components may be used in device 100 depending on the nature of the application.

Device 100 is shown containing imbalance estimator block 110, multiplexers 120, 170 and 190, transmitter 130, receiver 140, processor 150, and signal conditioning block 160. It may be noted that the components in the receive path (from path 187) are not shown/described as not being necessary for understanding various aspects of the present invention. The remaining components are described below in further detail.

Processor 150 generates a sequence of vector elements (representing corresponding symbols sought to be transmitted), with each vector element containing multiple vector components. For conciseness, only two vector components are assumed to be present in each vector element. However, various aspects of the present invention can be used with reference to vector elements containing more components.

The two vector components (corresponding to each symbol) are sent to transmitter 130 on paths 123 and 193 for transmission. However, the data for transmission may be generated from other sources such as external digital processing systems (e.g., from a computer via a network), digital data converted from analog signals (e.g., data representing voice), etc. Similarly, processor 150 may logically represent multiple units of processor circuits, with the transmit and receive vector elements being processed by different processor circuits.

Receiver 140 receives on path 174 an analog signal containing two modulated carrier signals at 90 degrees phase relationship to each other, and recovers the pairs of vector components from the received signals. Receiver 140 may receive the analog signal from transmitter 130 on path 167 or from any external transmitter on path 187. A sequence of vector elements representing corresponding symbols are generated (from the recovered vector components) and sent to processor 150 on paths 145 and 146. The recovered symbols enable transmitter 130 to be calibrated as described below in further detail. Receiver 140 may be implemented in a known way, and an example embodiment is described with reference to FIG. 2A below.

Figure 2A:
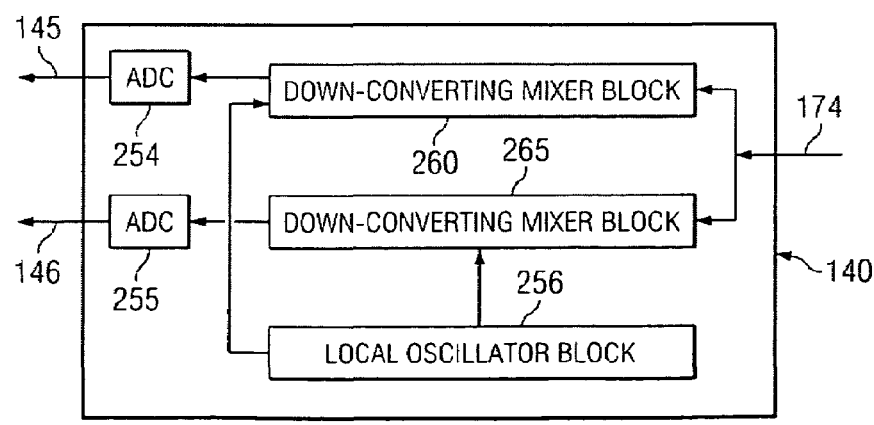
FIG. 2A is a block diagram illustrating the details of an example embodiment of a receiver.

FIG. 2A is a block diagram illustrating the details of an embodiment of receiver 140. Receiver 140 is shown containing down-conversion mixers 260 and 265, oscillator 256, and ADCs 254 and 255. Down-conversion mixer 260 generates an output vector component by de-modulating one of the two vector components contained in a modulated carrier signal (present as a component of the analog signal received on path 174), and mixer 265 generates another output vector component by demodulating the other vector component contained in the other modulated carrier signal. Both the mixers may operate using the signals generated by local oscillator 256. ADCs 254 and 255 respectively generate a corresponding output vector component (on paths 145 and 146) by sampling the vector components generated by mixers 260 and 265.

Continuing with reference to FIG. 1, transmitter 130 generates an analog signal (on path 108), containing two modulated carrier signals as components. The first and second modulated carrier signals may respectively encode the first and second vector components received on paths 123 and 193. The analog signal is sent to signal conditioning block 160 which may perform tasks such as filtering and amplification to make the analog signals suitable for transmission on path 108, and may be implemented in a known way. Transmitter 130 may also be implemented in a known way and example embodiment is described below with reference to FIG. 2B.

Figure 2B:
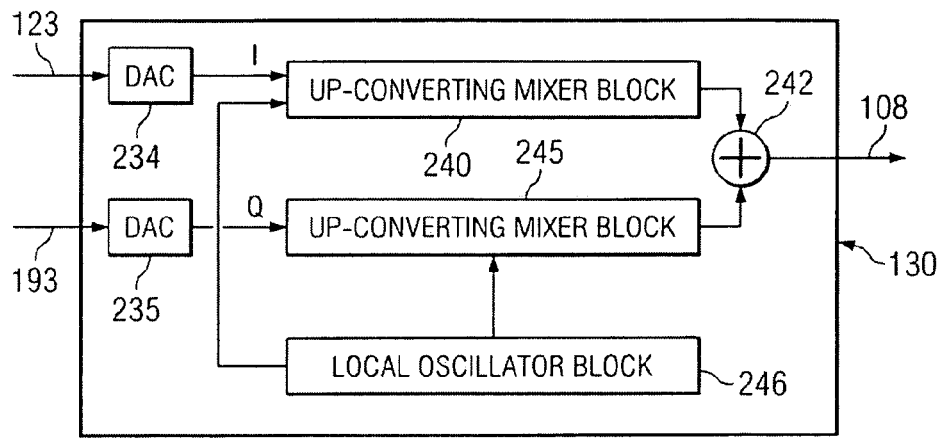
FIG. 2B is a block diagram illustrating the details of an example embodiment of a transmitter.

FIG. 2B is a block diagram illustrating the details of an embodiment of transmitter 130. Transmitter 130 is shown containing digital to analog converters (DAC) 234 and 235, up-conversion mixers 240 and 245, local oscillator 246, and adder 242. DACs 234 and 235 respectively generate a corresponding baseband signal by converting an input vector component received on paths 123 and 193.

Local oscillator 246 generates two carrier signals out-of-phase by 90 degrees, and provides the two carrier signals to mixers 240 and 245 respectively. Mixer 240 modulates the received carrier signal using the baseband signal (encoding the sequence of vector components) received from DAC 234, and generates a modulated carrier signal component. Similarly, mixer 245 also generates another modulated carrier signal component. The inputs to mixers 240 and 245 are respectively referred to as I and Q inputs. Adder 242 logically represents the addition of the two modulated carrier signal components, and the resulting analog signal is provided on path 108.

In general, it is desirable to minimize/avoid phase and gain imbalances in the signals transmitted on path 108.

However, if the imbalances are estimated, appropriate corrections may be implemented within transmitter 130, and at least for such a reason it may be desirable to estimate the imbalances. The remaining components imbalance estimator block 110, and multiplexers 120, 170 and 190 (of FIG. 1) are used to estimate such imbalances (and may be together referred to as a correction circuit) as described below in further details.

3. Correction Circuit

Continuing with reference to FIG. 1, multiplexer 120 selects either an input vector component (on path 152) or a calibration vector input (on path 112) as determined by select signal 192 under the control of imbalance estimator block 110. Multiplexer 190 also similarly selects one of the two corresponding inputs provided on paths 159 and 119 as determined by select signal 192. Multiplexer 170 selects one of the two analog signals received on paths 167 and 187 as determined by select signal 117. In general, the values of the select signals depend on whether device 100 is operating in a transmission mode (in which the data is being transmitted on path 108) or in a calibration mode (in which the gain/phase imbalances are being estimated).

In calibration mode, the calibration vector elements provided by imbalance estimator 110 on path 112 and 119 are provided as input vector elements to transmitter 130 and the output analog signal of transmitter 130 (on path 167) may be provided as input to receiver 140. As described in the sections below, the calibration vector inputs are designed to enable estimation of the phase and gain imbalances introduced by transmitter 130, and caused to be selected in a calibration mode. On the other hand, in the transmission mode, the two input vector components (on paths 152 and 159) selected by multiplexers 120 and 190 together represent a symbol sought to be transmitted.

Imbalance estimator block 110 provides calibration vector inputs on path 123 and 193 by controlling the operation of multiplexers 120 and 190. Multiplexer 170 may also be controlled to select the modulated carrier signal received from path 167 (instead of from path 187). Imbalance estimator block 110 may examine the corresponding output vector elements to determine the phase and gain imbalance (assuming accurate operation of receiver 140) as described below in further detail. It is helpful to first appreciate the manner in which each symbol sought to be transmitted may be represented, and how the imbalances affect the representations.

4. Vector Diagrams

Figure 3A:
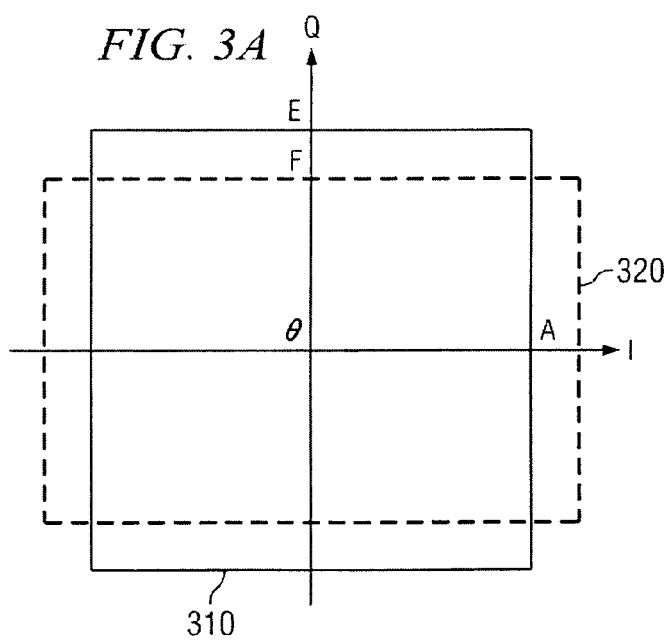
FIG. 3A is a diagram illustrating the characteristics of vector diagrams when no imbalances are present and when only gain imbalance is present.
Figure 3B:
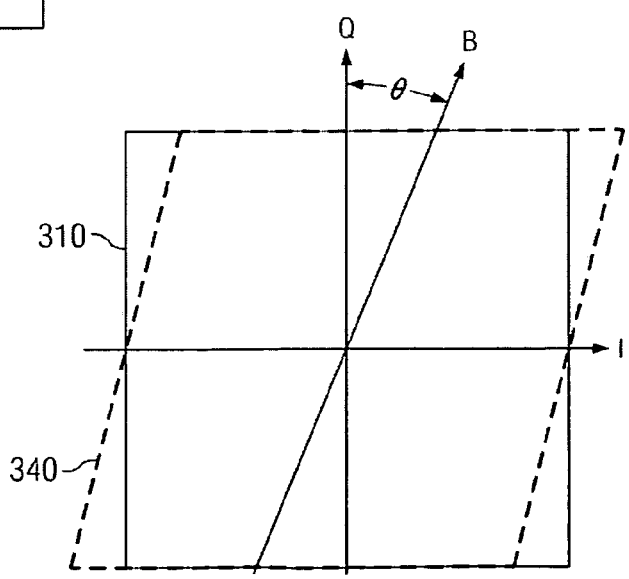
FIG. 3B is a diagram illustrating the characteristics of a vector diagram when only phase imbalance is present.
Figure 3C:
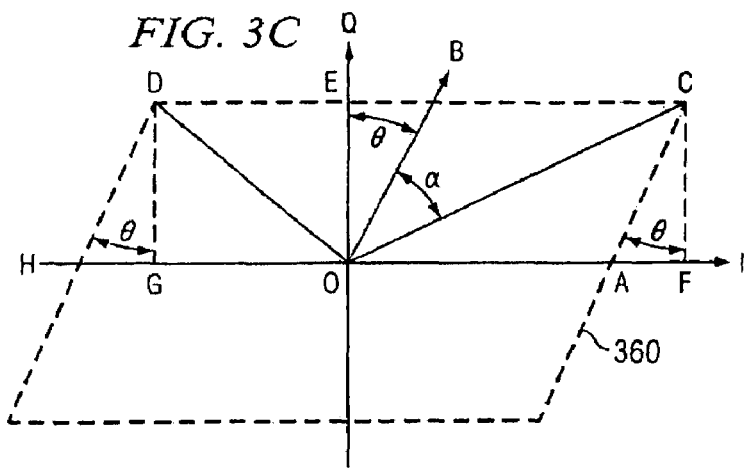
FIG. 3C is a diagram illustrating the characteristics of a vector diagram when both phase and gain imbalances are present.

FIGS. 3A-3C contain vector diagrams respectively illustrating the gain imbalance, the phase imbalance and the combined effect of both gain and phase imbalance in example scenarios. Each vector diagram is shown containing an I (in-phase) axis and quadrature (Q) axis, and each symbol is accordingly represented by two coordinates (referred to as vector elements). Each vector diagram contains a pre-specified number of symbols (e.g., 16), typically evenly distributed within the quadrilateral. Of relevance to an understanding of several aspects of the present invention is a quadrilateral covering all the symbols, and accordingly each of the FIGS. 3A-3C is described with reference to various quadrilaterals below.

FIG. 3A is shown containing square 310 and rectangle 320. Square 310 represents the vector diagram of an ideal transmitter with no gain and phase imbalance. As can be readily appreciated, the gain along both the axis (I and Q) is equal, thereby forming a square. When the (quadrature and in-phase) gains are unequal, the vector diagram is represented by a rectangle as illustrated with reference rectangle 320.

A variable $\alpha$ (alpha) is used to represent the gain imbalance, and equals the ratio of the length and widths of rectangle 320. Thus, the vectors representing each symbol would be correspondingly different (from that determined by square 310) as determined by $\alpha$. When there is no gain imbalance, $\alpha$ equals 1.

FIG. 3B is shown containing rhombus 340, representing a vector diagram corresponding to a scenario in which only phase imbalance is present (and no gain imbalance). The extent of phase imbalance is represented by $\theta$ (theta), as shown. FIG. 3C is shown containing a parallelogram 360 representing a combined effect of both gain imbalance ($\alpha$ not equal to 1) and phase imbalance ($\theta$ not equal to 0).

An aspect of the present invention enables the values of $\alpha$ and $\theta$ to be computed merely by sending appropriate calibration vector elements. The manner in which such a determination can be made is described below with reference to theoretical basis first.

5. Theoretical Basis

The theoretical basis for computation of $\alpha$ and $\theta$ is described with reference to FIG. 3C. Merely for simplification, OA is assumed to equal P units, and accordingly length OB=P×$\alpha$ (wherein, 'x' represents multiplication operation). The angle formed between OE (a perpendicular line from the origin accordingly to an ideal system) and OB is $\theta$. It may be helpful to appreciate that OC and OD are the transmitter vectors for determining alpha and OA and OB are the transmitted vectors for determining $\theta$. The manner in which $\alpha$ and $\theta$ may be computed is described below.

From triangle OCF, $OC^2=OF^2+CF^2$     Equation (1)

From triangle OEB, $CF=OE=P\alpha \cos\theta$     Equation (2)

From triangle ACF, $AF=CF \tan\theta$     Equation (3)

Substituting the relationship (CF=OE) in Equation (3), $AF=OE \tan\theta$     Equation (4)

Substituting Equation (2) in Equation (4), we have:

$AF=P\alpha \cos\theta * \tan\theta = P\alpha \sin\theta$     Equation (5)

$OF=OA+AF$     Equation (6)

Substituting Equation (5) in Equation (6) and since OA=P, we have:

$OF=P+P\alpha \sin\theta$     Equation (7)

Substituting Equations (2) and (7) in Equation (1), we have:

$$\begin{aligned} OC^2 &= (P+P\alpha \sin\theta)^2 + (P\alpha \cos\theta)^2 \\ &= P^2[(1+\alpha\sin\theta)^2 + (\alpha\cos\theta)^2] \\ &= P^2[1+\alpha^2\sin^2\theta + 2\alpha\sin\theta + \alpha^2\cos^2\theta] \\ &= P^2[1+\alpha^2(\sin^2\theta+\cos^2\theta)+2\alpha\sin\theta] \end{aligned}$$     Equation (8)

Substituting the relationship ($\sin^2\theta+\cos^2\theta=1$) in Equation (8), we have:

$OC^2=P^2(1+\alpha^2+2\alpha \sin\theta)$     Equation (9)

Similarly $OD^2=P^2(1+\alpha^2-2\alpha \sin\theta)$     Equation (10)

Solving for $\theta$ (using equations (9) and (10)), $$OC^2-OD^2=[P^2(1+\alpha^2+2\alpha\sin\theta)]-[P^2(1+\alpha^2-2\alpha\sin\theta)]$$

$$OC^2-OD^2/P^2=4\alpha\sin\theta \qquad \text{Equation (11)}$$

Similarly, $$OC^2+OD^2/P^2=2(1+\alpha^2) \qquad \text{Equation (12)}$$

Dividing equation (11) by equation (12), $$(OC^2-OD^2)/(OC^2+OD^2)=2\alpha\sin\theta/(1+\alpha^2) \qquad \text{Equation (13)}$$

If $\alpha\sim=1$ (wherein '$\sim=$' represents 'approximately equal to'), $$(OC^2-OD^2)/(OC^2+OD^2)=\sin\theta$$

$$[(OC^2/OD^2)-1]/[(OC^2/OD^2)+1]=\sin\theta \qquad \text{Equation (14)}$$

If $\theta$ is small, $\sin\theta$ approximately equals $\theta$.

Now, expression (10) may be written as (with $r_1=OC^2/OD^2$)

$$\theta=(r_1-1)/(r_1+1) \qquad \text{Equation (15)}$$

Thus, $\theta$ may be computed using Equation (15).

On the other hand, to determine $\alpha$, the value of OA and OB may be determined by providing appropriate calibration vector inputs (on paths 123 and 193). For example, when inputs I and Q (on paths 123 and 193) to transmitter 130 equal a known modulating value and a zero value respectively, the resultant vector (including the effects of imbalances) transmitted is OA. Similarly, when transmitter 130 inputs I and Q equal zero value and the known modulating value respectively, the resultant vector transmitted is OB (powers $P_4$ and $P_3$ measured at the output of the receiver).

$$\text{Therefore (with } r_2=OB^2/OA^2\text{), }\alpha=\text{square root of }(r_2) \qquad \text{Equation (16)}$$

Equations (15) and (16) represent mathematical relationships using which $\alpha$ and $\theta$ may be estimated. Imbalance estimator block 110 may thus be designed to generate the appropriate vectors as inputs and use the corresponding output values to estimate the phase and gain imbalances. The specific calibration vectors, which may be transmitted in an embodiment, are briefly described below.

6. Calibration Vectors

The specific relationship (in an embodiment) between calibration symbols (represented by corresponding vector elements) which enable $\theta$ to be estimated can be identified by examining equation (15). As may be readily noted, Equation (15) contains $r_1$, which is equal to $OC^2/OD^2$. Vector OC is caused by sending input vector components of the same values on paths 123 and 193 respectively. Thus, vector elements corresponding to OC represent a first calibration vector element. In comparison to vector OC, vector OD is caused by sending the values of same magnitude, but one being negative and another being positive on paths 123 and 193 respectively. The vector components (corresponding to OD) thus sent represent a second calibration vector element.

Calibration vector inputs which cause $\alpha$ to be estimated can be identified by examining equation (16). Equation (16) contains $r_2$ which is equal to $OB^2/OA^2$. OA represents a vector element with in-phase component corresponding to a known modulating value (or signal), and quadrature component being equal to zero. Thus, a vector corresponding to OA represents a third calibration vector element. Similarly, OB represents a vector element with quadrature component corresponding to the known modulating value, and in-phase component equaling zero. A vector element corresponding to OB represents a fourth calibration vector element.

Thus, using the calibration symbols (vectors) such as those determined above, imbalance estimator block 110 estimates the phase and gain imbalance as described below with reference to FIGS. 4A and 4B respectively.

7. Estimation of Phase Imbalance

Figure 4A:
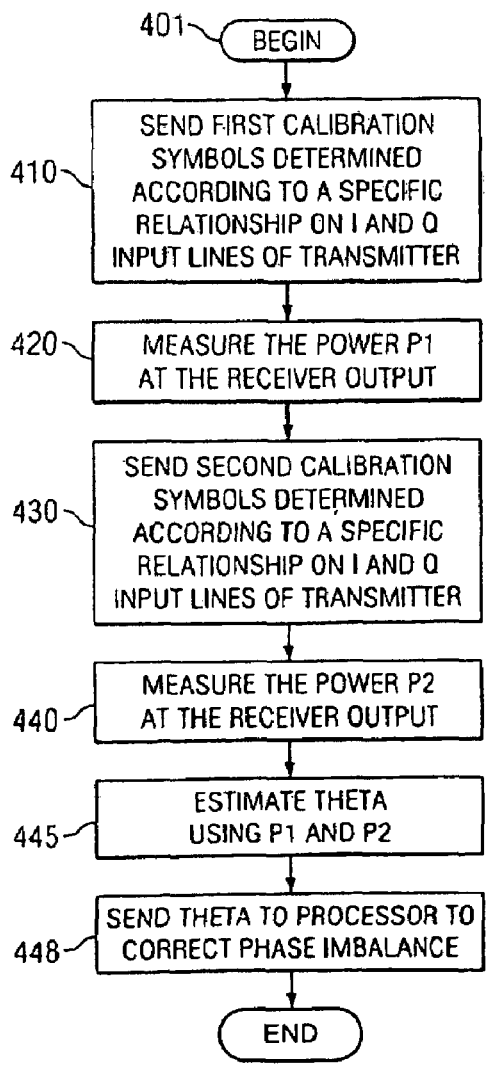
FIG. 4A is a flowchart illustrating the manner in which the phase imbalance can be estimated in an embodiment of the present invention.

FIG. 4A is a flowchart illustrating the manner in which the phase imbalance may be estimated in an embodiment of the present invention. For illustration, the method is described with reference to FIG. 1. However, the method can be implemented in other devices/environments as will be apparent to one skilled in the relevant arts based on the disclosure provided herein. Such other embodiments are contemplated to be within the scope and spirit of various aspects of the present invention. The method begins in step 401 in which control passes to step 410.

In step 410, first calibration symbols, determined according to a specific relationship, are sent on I and Q input lines of transmitter. Assuming for illustration that the specific relationship is as described above with reference to Equation 15, imbalance estimator block 110 may send symbols which cause vectors (i.e., known modulating values/symbols of the same sign, + or −) corresponding to OC, and control select lines 192 and 117 to ensure that the sent elements are received by receiver 140. In step 420, the output power $P_1$ due to the inputs provided in step 410, is measured at the receiver output. With reference to FIG. 1, imbalance estimator block 110 may determine power $P_1$ by examining the digital values received on paths 145/146 or corresponding analog signals presented as inputs to ADCs 254 and 255 (of FIG. 2). In general, power $P_1$ is determined by evaluating $\int(I_1^2+Q_1^2)\,dt$, (wherein $I_1$ and $Q_1$ respectively represent the voltages caused by the two vector components on paths 145 and 146 respectively, less a D.C. offset present in the signals, which can be determined in a known way) integrated over an integral number of cycles of calibration symbols provided by imbalance estimator block 110. $P_1$ may also be computed by suitable circuitry provided in imbalance estimator block 110.

In step 430, second calibration symbols, determined according to the specific relationship, are sent on I and Q input lines of transmitter. With reference to Equation 15, imbalance estimator block 110 may send symbols which cause vectors (modulating signal/values of the same magnitude, but with opposite sign) corresponding to OD, and control select lines 192 and 117 to ensure that the sent elements are received by receiver 140.

In step 440, the output power $P_2$ due to the inputs applied in step 430 is measured at the receiver output. Imbalance estimator block 110 may determine power $P_2$ by evaluating $\int(I_2^2+Q_2^2)\,dt$, (wherein $I_2$ and $Q_2$ respectively represent the voltages caused by the two vector components on paths 145 and 146 respectively, less a D.C. offset present in the signals, which can be determined in a known way) integrated over integral number of cycles of calibration symbols provided by imbalance estimator block 110.

In step 445, $\theta$ may be estimated using the output power $P_1$ and $P_2$ measured in steps 420 and 440. The value of $\theta$ is estimated by determining $r_1$ (the ratio of $P_1$ to $P_2$) and using the value of $r_1$ in equation (15). In step 448, the estimated value of $\theta$ is sent to processor 150, which is used to remove/minimize the phase imbalance. The method ends in step 449. The manner in which gain imbalance $\alpha$ may be estimated is described below in further detail.

8. Estimation of Gain Imbalance

Figure 4B:
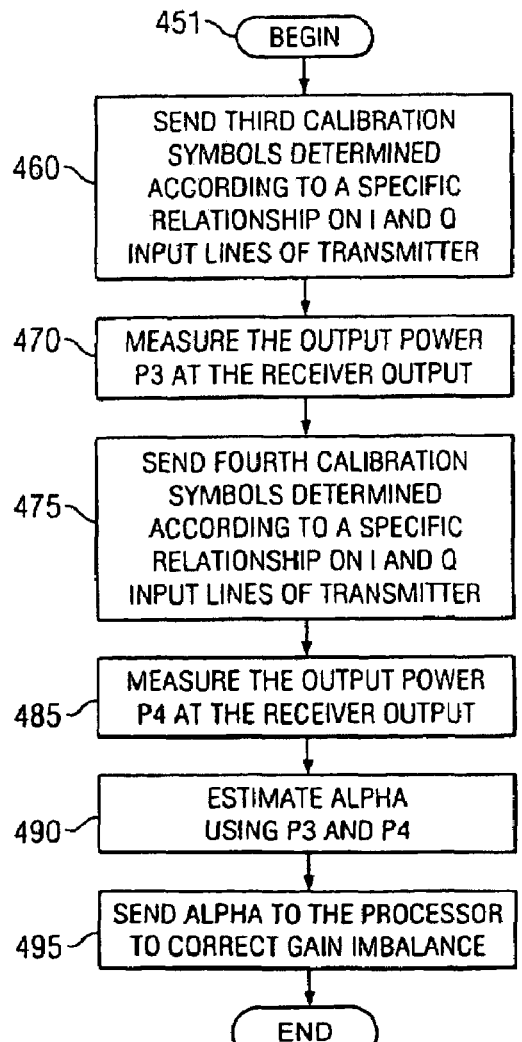
FIG. 4B is a flowchart illustrating the manner in which the gain imbalance can be estimated in an embodiment of the present invention.

FIG. 4B is a flowchart illustrating the manner in which the gain imbalance may be estimated in an embodiment of the present invention. For illustration, the method is described with reference to FIG. 1. However, the method can be implemented in other devices/environments as will be apparent to one skilled in the relevant arts based on the disclosure provided herein. Such other embodiments are contemplated to be within the scope and spirit of various aspects of the present invention. The method begins in step 451 in which control passes to step 460.

In step 460, third calibration symbols, determined according to a specific relationship, are sent on input lines of transmitter. Assuming for illustration that the specific relationship is as described above with reference to Equation 16, imbalance estimator block 110 may send symbols which cause vectors corresponding to OA, and control select lines 192 and 117 to ensure that the sent elements are received by receiver 140.

In step 470, the output power $P_3$ due to the inputs provided in step 460, is measured at the receiver output. With reference to FIG. 1, imbalance estimator block 110 may determine power $P_3$ by examining the digital values received on paths 145/146 or corresponding analog signals presented as inputs to ADCs 254 and 255 (of FIG. 2). In general, power $P_3$ is determined by evaluating $\int (I_3^2 + Q_3^2) \, dt$, (wherein $I_3$ and $Q_3$ respectively represent the voltages caused by the two vector components on paths 145 and 146 respectively, less a D.C. offset present in the signals, which can be determined in a known way) integrated over an integral number of cycles of calibration symbols provided by imbalance estimator block 110. $P_3$ may also be computed by suitable circuitry provided in imbalance estimator block 110.

In step 475, fourth calibration symbols, determined according to the specific relationship, are sent on input lines of transmitter. With reference to Equation 16, imbalance estimator block 110 may send symbols which cause vectors corresponding to OB, and control select lines 192 and 117 to ensure that the sent elements are received by receiver 140.

In step 485, the output power $P_4$ due to the inputs applied in step 475 is measured at the receiver output. Imbalance estimator block 110 may determine power $P_4$ by evaluating $\int (I_4^2 + Q_4^2) \, dt$, (wherein $I_4$ and $Q_4$ respectively represent the voltages caused by the two vector components on paths 145 and 146 respectively, less a D.C. offset present in the signals, which can be determined in a known way) integrated over integral number of cycles of calibration symbols provided by imbalance estimator block 110.

In step 490, $\propto$ may be estimated using the output power $P_3$ and $P_4$ measured in steps 470 and 485. The value of $\propto$ is estimated by determining $r_2$ (the ratio of $P_3$ to $P_4$) and using the value of $r_2$ in equation (16). In step 490, the estimated value of $\propto$ is sent to processor 150, which is used to remove/minimize the gain imbalance. It may be appreciated estimation of gain imbalance when more than 2 vector components are present, may entail designing and sending a correspondingly more number of calibration symbols (as in steps 460 and 475). The method ends in step 499.

From the above, it may be appreciated that imbalances may be measured by using implementations which are integrated into a transceiver. Accordingly, the correction circuit described above can be integrated along with a transmitter and a receiver into a single integrated circuit, and such an integrated circuit may be referred to as a monolithic integrated circuit.

9. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of estimating an imbalance of a transmitter when transmitting each symbol as multiple vector components, said method comprising:

sending first plural vector symbols from said transmitter;

measuring a first power corresponding to said first plural vector symbols at a receiver;

sending second plural vector symbols, different from said first plural vector symbols, from said transmitter;

measuring a second power corresponding to said second plural vector symbols at said receiver; and estimating said imbalance based on said first power and said second power, wherein each of said first plural vector symbols and said second plural vector symbols comprises a corresponding pair of vectors containing a first vector and a second vector, said method further comprising:

modulating a first carrier signal using said first vector to generate a first modulated signal;

modulating a second carrier signal using said second vector to generate a second modulated signal; and combining said first modulated signal and said second modulated signal to generate an analog signal, wherein each of said first plural vector symbols and said second plural vector symbols are encoded in said analog signal, wherein said transmitter and said receiver are integrated into a single transceiver, wherein said imbalance comprises a phase imbalance, wherein each of a first pair of vectors forming one of said first plural vector symbols and said second plural vector symbols comprises a first value of same sign for vector components, and a second pair of vectors forming another one of said first plural vector symbols and said second plural vector symbols comprises said first value but with opposite sign, wherein said first power is measured in response to sending said first values of same sign, and said second power is measured in response to sending said first values with opposite sign, and wherein said phase imbalance is computed according to an equation (r1−1)/(r1+1), wherein r1 equals said first power/said second power, wherein − and + respectively represent subtraction and addition mathematical operations, and wherein / represents a division operation.

2. A method of estimating an imbalance of a transmitter when transmitting each symbol as multiple vector components, said method comprising:

sending first plural vector symbols from said transmitter;

measuring a first power corresponding to said first plural vector symbols at a receiver;

sending second plural vector symbols, different from said first plural vector symbols, from said transmitter;

measuring a second power corresponding to said second plural vector symbols at said receiver; and estimating said imbalance based on said first power and said second power, wherein each of said first plural vector symbols and said second symbols comprises a corresponding pair of vector containing a first vector and a second vector, said method further comprising:

modulating a first carrier signal using said first vector to generate a first modulated signal;

modulating a second carrier signal using a second vector to generate a second modulated signal; and combining said first modulated signal and said second modulated signal to generate an analog signal, wherein each of said first plural vector symbols and said second plural vector symbols are encoded in said analog signal, wherein said transmitter and said receiver are integrated into a single transceiver, wherein said imbalance comprises a gain imbalance, wherein one of said first plural vector symbols and said second plural vector symbols contains a first vector of a second value and a second vector of zero value, and another one of said first plural vector symbols and said second plural vector symbol contains said first vector of zero value and said second vector of said second value.

3. The method of claim 2, wherein said gain imbalance is computed according to an equation $$\sqrt{r_2},$$

where $r_2$ equals said second power/said first power, wherein / represents a division operation.

4. A transceiver comprising;

a transmitter sending first plural vector symbols and then second plural vector symbols, different from said first plural vector symbols, in the form an analog signal, wherein said first plural vector symbols and said second plural vector symbols are encoded in said analog signal;

a receiver receiving said analog signal and recovering said first plural vector symbols and said second plural vector symbols; and a correction circuit measuring a first power corresponding to said first plural vector symbols and a second power corresponding to said second plural vector symbols, said correction circuit estimating an imbalance in said transmitter based on said first power and said second power, wherein said correction circuit comprises a multiplexor to select said analog signal or an external signal, wherein said external signal is generated by an external device and sent to a device containing said transceiver, wherein said analog signal is selected when said imbalance is being estimated; and wherein each of said first plural vector symbols and said second plural vector symbols comprises a corresponding pair of vector containing a first vector and a second vector, wherein said transmitter comprises:

a first local oscillator generating a first carrier signal and a second carrier signal in quadrature phase;

a first digital to analog converter (DAC) converting said first vector to a first baseband signal;

a second DAC converting said second vector to a second baseband signal;

a first up-converting mixer modulating a first carrier signal using said first baseband signal to generate a first modulated signal;

a second up-converting mixer modulating a second carrier signal using said second baseband signal to generate a second modulated signal; and an adder combining said first modulated signal and said second modulated signal to generate said analog signal, wherein each of said first plural vector symbols and said second plural vector symbols are encoded in said analog signal.

5. The transceiver of claim 4, said transceiver further comprising:

a first down-converting mixer demodulating said first modulated signal to generate a first demodulated signal;

a second down-converting mixer demodulating said second modulated signal to generate a second demodulated signal;

a first analog to digital converter (ADO) converting said first demodulated signal to generate said first vector; and a second analog to digital converter (ADO) converting said second demodulated signal to generate said second vector.

6. The transceiver of claim 5, wherein said imbalance comprises a phase imbalance, wherein each of a pair of vectors forming one of said first plural vector symbols and said second plural vector symbols comprises a first value of same sign for vector components, and a pair of vector forming another one of said first plural vector symbols and said second plural vector symbols comprises said first value but with opposite sign, wherein said first power is measured in response to sending said first value of same sign, and said second power is measured in response to sending said first value with opposite sign.

7. The transceiver of claim 6, wherein said phase imbalance is computed according to an equation (r1−1)/(r1+1), wherein r1 equals said first power/said second power, wherein − and + respectively represent subtraction and addition mathematical operations, and wherein / represents a division operation.

8. The transceiver of claim 5, wherein said imbalance comprises a gain imbalance, wherein one of said first plural vector symbols and said second plural vector symbols containing a first vector of a second value and a second vector of zero value, and another one of said first plural vector symbols and said second plural vector symbols containing said first vector of zero value and said second vector of said second value.

9. The transceiver of claim 6, wherein said gain imbalance is computed according to an equation $$\sqrt{r_2},$$

where r equals said second power/said first power, wherein / represents a division operation.

10. A device comprising:

A processor;

a transmitter coupled to said processor, said transmitter sending first plural vector symbols and then second plural vector symbols, different from said first plural vector symbols, in the form an analog signal, wherein said first plural vector symbols and said second plural vector symbols are encoded in said analog signal;

a receiver receiving said analog signal and recovering said first plural vector symbols and said second plural vector symbols; and a correction circuit measuring a first power corresponding to said first plural vector symbols and a second power corresponding to said second plural vector symbols, said correction circuit estimating an imbalance in said transmitter based on said first power and said second power, wherein said correction circuit comprises a multiplexor to select said analog signal or an external signal, wherein said external signal is generated by an external device and sent to a device containing said transceiver, wherein said analog signal is selected when said imbalance is being estimated; and wherein each of said first plural vector symbols and said second plural vector symbols comprises a corresponding pair of vector containing a first vector and a second vector, wherein said transmitter comprises;

a first local oscillator generating a first carrier signal and a second carrier signal in quadrature phase;

a first digital to analog converter (DAC) converting said first vector to a first baseband signal;

a second DAC converting said second vector to a second baseband signal;

a first up-converting mixer modulating a first carrier signal using said first baseband signal to generate a first modulated signal;

a second up-converting mixer modulating a second carrier signal using said second baseband signal to generate a second modulated signal; and an adder combining said first modulated signal and said second modulated signal to generate said analog signal, wherein each of said first plural vector symbols and said second plural vector symbols are encoded in said analog signal.

11. The device of claim 10, said device further comprising:

a first down-converting mixer demodulating said first modulated signal to generate a first demodulated signal;

a second down-converting mixer demodulating said second modulated signal to generate a second demodulated signal;

a first analog to digital converter (ADC) converting said first demodulated signal to generate said first vector; and a second analog to digital converter (ADC) converting said second demodulated signal to generate said second vector.

12. The device of claim 11, wherein said imbalance comprises a phase imbalance, wherein each of a pair of vector forming one of said first plural vector symbols and said second plural vector symbols comprises a first value of same sign for vector components, and a pair of vector forming another one of said first plural vector symbols and said second plural vector symbols comprises said first value but with opposite sign, wherein said first power is measured in response to sending said first value of same sign, and said second power is measured in response to sending said first value with opposite sign.

13. The device of claim 12, wherein said phase imbalance is computed according to an equation $(r1-1)/(r1+1)$, wherein r1 equals said first power/said second power, wherein − and + respectively represent subtraction and addition mathematical operations, and wherein / represents a division operation.

14. The device of claim 11, wherein said imbalance comprises a gain imbalance, wherein one of said first plural vector symbols and said second plural vector symbols containing a first vector of a second value and a second vector of zero value, and another one of said first plural vector symbols and said second plural vector symbols containing said first vector of zero value and said second vector of said second value.

15. The device of claim 12, wherein said gain imbalance is computed according to an equation $$\sqrt{r_2},$$

where $r_2$ equals said second power/said first power, wherein / represents a division operation.

16. The device of claim 10, wherein said transmitter and said receiver are contained in a single transceiver.

17. The device of claim 10, wherein said first plural vector symbols are contained in a first sequence of symbols and said second plural vector symbols are contained in a second sequence of symbols, wherein said first power and said second power are computed based on said first sequence of plural vector symbols and said second sequence of plural vector symbols respectively.

18. The device of claim 10, wherein said first carrier signal comprises an in-phase carrier signal and said second carrier signal comprises a quadrature carrier signal.

* * * * *